United States Patent
Hao

(10) Patent No.: US 12,417,907 B2
(45) Date of Patent: Sep. 16, 2025

(54) METHOD FOR INCREASING BRIDGING PROCESS WINDOW OF CONTACT HOLE AND GATE OF DEVICE

(71) Applicant: Shanghai Huali Integrated Circuit Corporation, Shanghai (CN)

(72) Inventor: Yenxia Hao, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 391 days.

(21) Appl. No.: 18/201,453

(22) Filed: May 24, 2023

(65) Prior Publication Data

US 2024/0170277 A1   May 23, 2024

(30) Foreign Application Priority Data

Nov. 22, 2022   (CN) .......................... 202211466813.0

(51) Int. Cl.
| | | |
|---|---|---|
| H01L 21/02 | (2006.01) | |
| C23C 16/36 | (2006.01) | |
| C23C 16/455 | (2006.01) | |

(52) U.S. Cl.
CPC ........ H01L 21/02126 (2013.01); C23C 16/36 (2013.01); C23C 16/45536 (2013.01); H01L 21/0228 (2013.01)

(58) Field of Classification Search
None
See application file for complete search history.

(56) References Cited

U.S. PATENT DOCUMENTS

| | | | |
|---|---|---|---|
| 2010/0130024 A1* | 5/2010 | Takasawa | H01L 21/02145 118/692 |
| 2014/0213067 A1* | 7/2014 | Murakami | C23C 16/45544 118/724 |
| 2015/0118865 A1* | 4/2015 | Shimizu | C23C 16/45527 438/786 |
| 2016/0225617 A1* | 8/2016 | Noda | C23C 16/46 |
| 2018/0033614 A1* | 2/2018 | Chandra | C23C 16/345 |

* cited by examiner

Primary Examiner — Asok K Sarkar
(74) Attorney, Agent, or Firm — Banner & Witcoff, Ltd.

(57) ABSTRACT

The present application provides a method for increasing the process window to avoid bridging between the device's contact hole and gate, including: placing a semiconductor structure containing a gate structure in a reaction cavity, wherein reaction gases fed sequentially into the reaction cavity include the first reaction gas containing Si and Cl, a second reaction gas containing C and a third reaction gas containing O. Thus, a first film containing Cl is formed on the sidewalls of the gate structure. Further, a fourth reaction gas containing H is fed into the reaction cavity, after the fourth reaction gas completes reaction with Cl in the first film, a second film is formed on the sidewalls of the gate. A fifth gas containing N is then fed into the reaction cavity, which reacts with the second film to form a third film on the spacer of the gate structure.

10 Claims, 1 Drawing Sheet

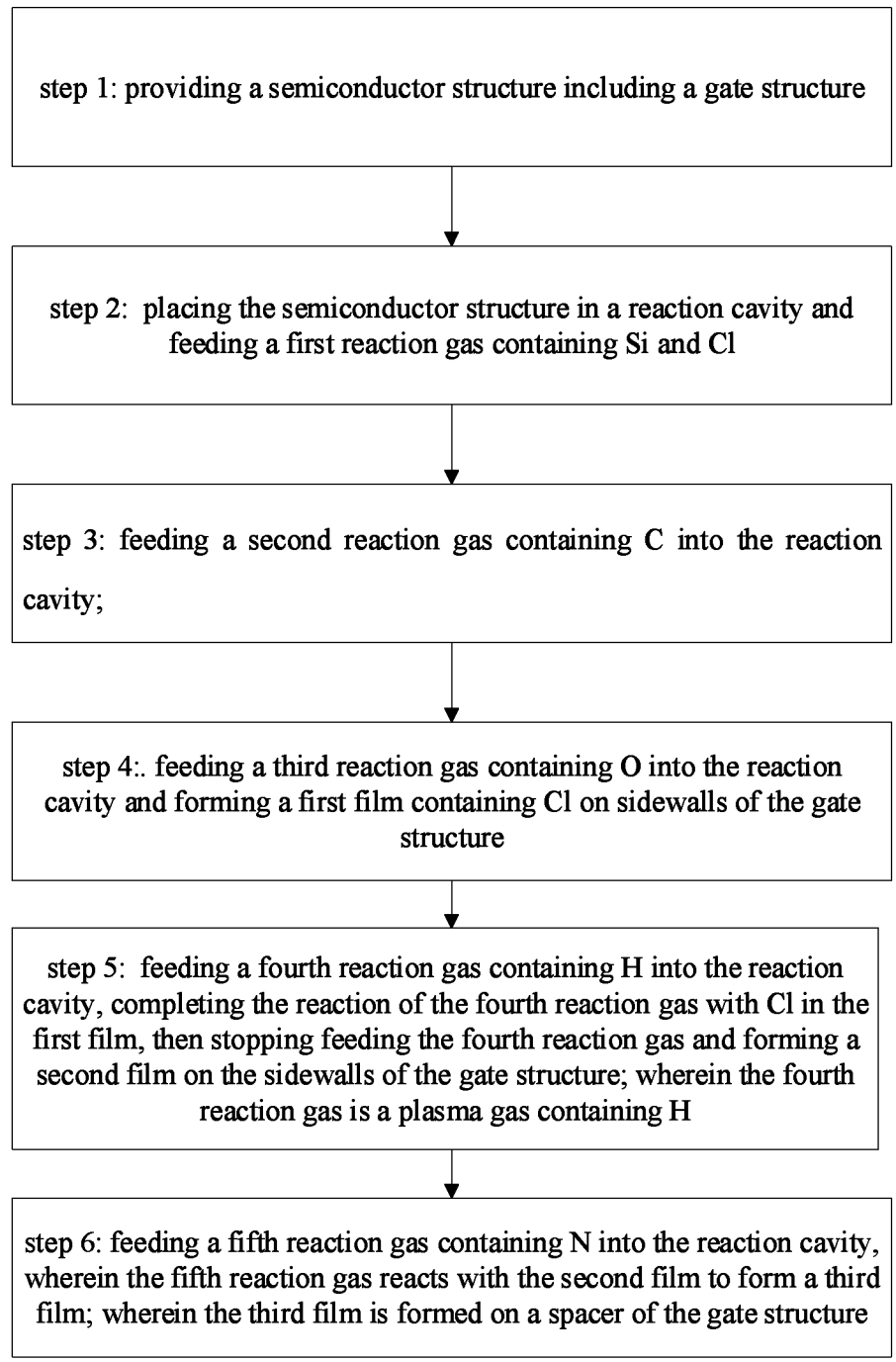

METHOD FOR INCREASING BRIDGING PROCESS WINDOW OF CONTACT HOLE AND GATE OF DEVICE

CROSS-REFERENCES TO RELATED APPLICATIONS

This application claims priority to Chinese patent application No. 202211466813.0, filed on Nov. 22, 2022 at CNIPA, and entitled "METHOD FOR INCREASING BRIDGING PROCESS WINDOW OF CONTACT HOLE AND GATE OF DEVICE", the disclosure of which is incorporated herein by reference in its entirety.

TECHNICAL FIELD

The present application relates to the field of semiconductor technology, and in particular, to a method for increasing a bridging process window of a contact hole and a gate of a device.

BACKGROUND

For flat-plate field effect transistors, silicon nitride (Si3N4) which has a dielectric constant k of the Si-nitride is approximately reported at 7.5 is often used as materials for sidewalls to define a location where shallow doping ions are injected. In this flat-plate structure, the parasitic capacitance from a space between the contact hole and the gate is often neglected. When the fin structure (FINFET) structures emerge for CMOS transistors, the distance between the contact hole and the gate is decreased, whereas the strip structure of the contact hole causes an increase of the area for parasitic capacitance. So the combined influence of these two factors leads to an interference effect on the circuit from the increased parasitic capacitance between the contact hole and the gate.

In order to reduce the parasitic capacitance in a FINFET device, a film of silicon oxycarbonitride (SIOCN which has a dielectric constant k~5) grown by atomic vapor deposition (ALD) is often applied as a spacer to reduce the k value of the parasitic capacitance. However, because of the high etching rate of SIOCN, gates may be enlarged during a process stage for manufacturing metal gates, resulting in a short circuit between the contact hole and the polysilicon gate. This causes a failure of the device. Therefore, it is particularly important to prepare sidewall films with both a low k and a low etch rate.

BRIEF SUMMARY

In view of the above mentioned disadvantages in the existing techniques, the present application provides a method for increasing the bridging process window of a contact hole and a gate of a device to avoid short circuit caused device failure between the contact hole and the polysilicon gate caused by the spacers of FINFET devices, which short circuit in turn.

The present application provides a method for increasing a bridging process window of a contact hole and a gate of a device, the method comprises steps of:
step 1: providing a semiconductor structure comprising a gate structure;
step 2: placing the semiconductor structure in a reaction cavity and feeding a first reaction gas containing silicon (Si) and chlorine (Cl) into the reaction cavity;
step 3: feeding a second reaction gas containing carbon (C) into the reaction cavity;
step 4: feeding a third reaction gas containing oxygen (O) into the reaction cavity and forming a first film containing Cl on the sidewalls of the gate structure;
step 5. feeding a fourth reaction gas containing hydrogen (H) into the reaction cavity, after complete reaction of the fourth reaction gas with Cl in the first film, stopping feeding the fourth reaction gas and forming a second film on the sidewalls of the gate structure; and the fourth reaction gas being a plasma gas containing H; and
step 6. feeding a fifth reaction gas containing nitrogen (N) into the reaction cavity, wherein the fifth reaction gas reacts with the second film to form a third film; and the third film is formed on a spacer of the gate structure.

According to one embodiment, the first reaction gas in step 2 is $Si_2Cl_6$.

According to one embodiment, the second reaction gas in step 3 is $C_3H_6$.

According to one embodiment, the reaction cavity is purified after the end of step 2 and before starting step 3.

According to one embodiment, the third reaction gas in step 4 is oxygen.

According to one embodiment, the reaction cavity is purified after the end of step 3 and before starting step 4.

According to one embodiment, the fourth reaction gas in step 5 is $H_2$.

According to one embodiment, the reaction cavity is purified after the end of step 4 and before starting step 5.

According to one embodiment, the fifth reaction gas in step 6 is $NH_3$.

As described above, the method of the present application for increasing a bridging process window of a contact hole and a gate of a device has the following beneficial effects: the present application proposes a step of adding hydrogen plasma gas during the SiOCN film growth process using atomic layer deposition, and the SiOCN film prepared by the method has both low k and a low etch rate, increasing a bridging process window of a contact hole and a gate of a device to meet the device process requirements.

BRIEF DESCRIPTION OF THE DRAWINGS

FIG. 1 shows a flow chart of the method for increasing a process window to avoid bridging between a contact hole and a gate of a device according to the present application.

DETAILED DESCRIPTION OF THE DISCLOSURE

The implementation of the present application is illustrated in the following by specific embodiments, and other advantages and effects of the present application can be readily understood by those skilled in the art from the disclosure in the description. The present application may also be implemented or applied by further different specific implementations, and details in the description may be modified or changed in various ways based on different views and applications without departing from the spirit of the present application.

Please refer to FIG. 1. It should be noted that the illustrations provided in the embodiments only schematically illustrate the basic concept of the present application. The figures only show components related to the application and are not draw according to the number, shape and size of components in actual implementation, and the pattern, number and proportion of the components in actual implementation may be arbitrarily changed, and the layout pattern of the components may be more complex.

The present application provides a method for increasing a process window to avoid bridging between a contact hole and a gate of a device, referring to FIG. 1, it shows a flow chart of the method of the present application for increasing the process window to avoid bridging between a contact hole and a gate of a device, and the method in the present application includes at least the following steps:

step 1: providing a semiconductor structure including a gate structure, wherein the semiconductor structure in this embodiment includes a FinFET device structure fabricated on the substrate, and the FinFET device structure includes a gate structure for forming a metal gate;

step 2: placing the semiconductor structure in a reaction cavity and feeding a first reaction gas containing Si and Cl, wherein from step 2 to step 4, ALD (atomic layer deposition) is used to form subsequent spacers for the gate structure.

Further in the present application, the first reaction gas in step 2 of in this embodiment is $Si_2Cl_6$. In other embodiments, the first reaction gas can also be other gases containing Si and Cl. Further in the present application, in this embodiment, the reaction cavity is purified after the end of step 2 and before starting step 3.

Step 3. feeding a second reaction gas containing C into the reaction cavity;

further in the present application, the second reaction gas in step 3 of this embodiment is $C_3H_6$. In other embodiments, the second reaction gas may also be other gases containing C.

Further in the present application, in this embodiment, the reaction cavity is purified after the end of step 3 and before starting step 4.

Step 4. feeding a third reaction gas containing O into the reaction cavity and forming a first film containing Cl on the sidewalls of the gate structure;

further in the present application, the third reaction gas in step 4 of this embodiment is oxygen. In other embodiments, the third reaction gas may also be other gas containing O.

Further in the present application, in this embodiment, the reaction cavity is purified after the end of step IV and before starting step 5.

Step 5. feeding a fourth reaction gas containing H into the reaction cavity, after complete reaction of the fourth reaction gas with Cl in the first film, stopping feeding the fourth reaction gas and forming a second film on the sidewalls of the gate structure; the fourth reaction gas being a plasma gas containing H; and the second film being used to subsequently form the spacer on the sidewalls of the gate structure.

Further in the present application, the fourth reaction gas in step 5 of this embodiment is $H_2$. In other embodiments, the fourth reaction gas may also be other plasma gas containing H.

Step 6. feeding a fifth reaction gas containing N into the reaction cavity, wherein the fifth reaction gas reacts with the second film to form a third film; and the third film being formed on a spacer of the gate structure.

Further in the present application, the fifth reaction gas in step 6 of this embodiment is $NH_3$. In other embodiments, the fifth reaction gas may also be other gas containing N.

Further, the third film formed in step 6 of this embodiment is SiOCN, and the third film (SiOCN) serves as a spacer of the gate structure of the FinFET device.

In summary, the present application proposes a step of adding hydrogen plasma gas during the SiOCN film growth process where atomic layer deposition is applied, and the SiOCN film prepared by the method has both low k and a low etch rate, increasing a bridging process window of a contact hole and a gate of a device to meet the device process requirements. Therefore, the present application effectively overcomes the issues in the existing techniques, so has high use value in industry.

The above embodiments are only illustrative of the principle of the present application and effects thereof, and are not intended to limit the present application. Any person skilled in the art may modify or change the above embodiments without departing from the spirit and scope of the present application. Therefore, all equivalent modifications or alterations made by those skilled in the art shall still be covered by the claims of the present application without departing from the spirit and technical ideas revealed by the present application.

What is claimed is:

1. A method for increasing a process window to avoid bridging between a contact hole and a gate of a device, wherein the method comprises following steps:

step 1: providing a semiconductor structure comprising a gate structure;

step 2: placing the semiconductor structure in a reaction cavity and feeding a first reaction gas containing Si and Cl;

step 3: feeding a second reaction gas containing C into the reaction cavity;

step 4: feeding a third reaction gas containing O into the reaction cavity and forming a first film containing Cl on sidewalls of the gate structure;

step 5: feeding a fourth reaction gas containing H into the reaction cavity, completing the reaction of the fourth reaction gas with Cl in the first film, then stopping feeding the fourth reaction gas and forming a second film on the sidewalls of the gate structure; wherein the fourth reaction gas is a plasma gas containing H; and step 6: feeding a fifth reaction gas containing N into the reaction cavity, wherein the fifth reaction gas reacts with the second film to form a third film; wherein the third film is formed on a spacer of the gate structure.

2. The method for increasing the process window to avoid bridging between the contact hole and the gate of the device according to claim 1, wherein the first reaction gas in the step 2 is $Si_2Cl_6$.

3. The method for increasing the process window to avoid bridging between the contact hole and the gate of the device according to claim 2, wherein the second reaction gas in step 3 is $C_3H_6$.

4. The method for increasing the process window to avoid bridging between the contact hole and the gate of the device according to claim 3, wherein the reaction cavity is purified after ending step 2 and before starting step 3.

5. The method for increasing the process window to avoid bridging between the contact hole and the gate of the device according to claim 4, wherein the third reaction gas in step 4 is oxygen.

6. The method for increasing the process window to avoid bridging between the contact hole and the gate of the device according to claim 5, wherein the reaction cavity is purified after ending step 3 and before starting step 4.

7. The method for increasing the process window to avoid bridging between the contact hole and the gate of the device according to claim 6, wherein the fourth reaction gas in step 5 is $H_2$.

8. The method for increasing the process window to avoid bridging between the contact hole and the gate of the device according to claim 7, wherein the reaction cavity is purified after ending step 4 and before starting step 5.

9. The method for increasing the process window to avoid bridging between the contact hole and the gate of the device according to claim 8, wherein the fifth reaction gas in step 6 is $NH_3$.

10. The method for increasing the process window to avoid bridging between the contact hole and the gate of the device according to claim 9, wherein the third film formed in step 6 is SiOCN.

\* \* \* \* \*